United States Patent
Kawano et al.

(10) Patent No.: US 9,202,999 B2
(45) Date of Patent: Dec. 1, 2015

(54) LIGHT EMITTING DEVICE AND ITS METHOD OF MANUFACTURE

(71) Applicant: NICHIA CORPORATION, Anan (JP)

(72) Inventors: Yusuke Kawano, Anan (JP); Satoshi Okada, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 13 days.

(21) Appl. No.: 14/158,260

(22) Filed: Jan. 17, 2014

(65) Prior Publication Data

US 2014/0203305 A1    Jul. 24, 2014

(30) Foreign Application Priority Data

Jan. 18, 2013   (JP) ................................. 2013-007896

(51) Int. Cl.
| | | |
|---|---|---|
| *H01L 33/00* | (2010.01) | |
| *H01L 33/58* | (2010.01) | |
| *H01L 33/48* | (2010.01) | |
| *H01L 33/56* | (2010.01) | |
| *H01L 33/50* | (2010.01) | |

(52) U.S. Cl.
CPC .............. *H01L 33/58* (2013.01); *H01L 33/486* (2013.01); *H01L 33/50* (2013.01); *H01L 33/56* (2013.01); *H01L 2924/0002* (2013.01); *H01L 2933/005* (2013.01)

(58) Field of Classification Search
CPC ....... H01L 33/50; H01L 33/56; H01L 33/486; H01L 2924/0002; H01L 2933/005; H01L 2924/00
See application file for complete search history.

(56) References Cited

U.S. PATENT DOCUMENTS

| | | | |
|---|---|---|---|
| 7,282,748 B2 | 10/2007 | Takeda et al. | |
| 7,521,728 B2 * | 4/2009 | Andrews | 257/100 |
| 2006/0226759 A1 | 10/2006 | Masuda et al. | |
| 2010/0237370 A1 * | 9/2010 | Kim et al. | 257/98 |
| 2011/0180832 A1 | 7/2011 | Kim | |
| 2012/0193665 A1 | 8/2012 | Yamada | |
| 2013/0207130 A1 * | 8/2013 | Reiherzer | 257/88 |

FOREIGN PATENT DOCUMENTS

| | | | |
|---|---|---|---|
| JP | 2008-041290 | * | 2/2008 |
| JP | 2008-282754 | | 11/2008 |
| JP | 2009-135485 | | 6/2009 |
| JP | 2011-159970 | | 8/2011 |
| JP | 2012-156442 | | 8/2012 |

OTHER PUBLICATIONS

Extended European Search Report for corresponding EP Application No. 14151582.5-1551, May 6, 2014.

* cited by examiner

*Primary Examiner* — Su C Kim
(74) *Attorney, Agent, or Firm* — Mori & Ward, LLP

(57) ABSTRACT

The light emitting device is provided with a substrate, semiconductor light emitting elements mounted on the substrate, a mold frame that surrounds the periphery of the light emitting elements on the substrate, and resin layers that fill the inside of the mold frame. The mold frame includes a first mold frame, and a second mold frame formed on top of the first mold frame. The resin layers include a first resin layer that embeds the light emitting elements in resin and is formed with a height approximately equal to the height of the top of the first mold frame, and a second resin layer on top of the first resin layer that is formed with a height approximately equal to the height of the top of the second mold frame. At least one of the resin layers (which are the first resin layer and the second resin layer) includes wavelength-shifting material to change the wavelength of light emitted from the semiconductor light emitting elements.

18 Claims, 9 Drawing Sheets

LIGHT EMITTING DEVICE AND ITS METHOD OF MANUFACTURE

BACKGROUND OF THE INVENTION

1. Field of the Invention

The present invention relates to a light emitting device housing semiconductor light emitting elements such as light emitting diodes (LEDs), and to its method of manufacture.

2. Description of the Related Art

In recent years, use of lower power consuming light emitting diodes (LEDs) in place of conventional incandescent light bulbs has been increasing in applications such as general lighting (illumination fixtures), and the range of applications is expanding. Within those applications, to improve the light extraction efficiency of secondary optics in apparatus such as spotlights and light projecting systems, there is demand for LEDs that emit high output, high quality light from a small intense light emitting area with little luminance and color (chromatic) non-uniformity across the light emitting surface.

As a technique to reduce light emission non-uniformities, the method of diffusing light by including filler in the light emitting element encapsulating material is known. For example, design to implement a white light emitting diode (LED) leads to consideration of a light emitting device that combines a blue LED with yellow-fluorescing yttrium-aluminum-garnet (YAG, $Y_3Al_5O_{12}$) fluorescent material, which is excited by light emitted by the blue LED. In this light emitting device, YAG fluorescent material is distributed in the resin or other encapsulating material that encapsulates the blue LED mounted inside a mounting cavity. In addition, by including diffusion material along with the fluorescent material in the encapsulating material, the fluorescent material has better dispersion within the encapsulating resin.

However, color non-uniformity can arise in this type of structure. Specifically, if the optical path length is examined for light prior to exiting the emitting surface of the light emitting device, there is a difference in the path length for light emitted directly upward from the LED and light that obliquely traverses through the encapsulating material after emission from the LED. As a result, the longer the optical path length, the more color-shift occurs due to the increase in light components produced by excitation of fluorescent material distributed in the encapsulating material. Consequently, when the light emitting device is viewed from directly above the light emitting surface, a color-shifted ring can appear around the perimeter of the light emitting surface.

Refer to Japanese Laid-Open Patent Publications 2008-041290, 2008-282754, and 2011-159970.

The present invention was developed to resolve these types of prior art drawbacks. Thus, it is a primary object of the present invention to provide a light emitting device and its method of manufacture that suppresses color non-uniformity and improves the quality of the output light.

SUMMARY OF THE INVENTION

To realize the object above, the light emitting device for one aspect of the present invention is provided with a substrate, semiconductor light emitting elements mounted on the substrate, a mold frame that surrounds the periphery of the light emitting elements, and resin layers that fill the inside of the mold frame. The mold frame includes a first mold frame, and a second mold frame formed on top of the first mold frame. The resin layers include a first resin layer that embeds the light emitting elements in resin and is formed with a height approximately equal to the height of the top of the first mold frame, and a second resin layer on top of the first resin layer that is formed with a height approximately equal to the height of the top of the second mold frame. Wavelength-shifting material to change the wavelength of light emitted from the semiconductor light emitting elements can be included in at least one of the resin layers (which are the first and second resin layers). With this structure, the first resin layer is formed with approximately uniform thickness making it possible to emit high quality light with color non-uniformity suppressed.

The light emitting device method of manufacture for another aspect of the present invention is a method of manufacturing a light emitting device provided with a substrate, semiconductor light emitting elements mounted on the substrate, a mold frame that surrounds the periphery of the light emitting elements, and resin layers that fill the encapsulating region established by the mold frame. The method can include a step to form a first mold frame on the substrate, a step to fill the inside of the encapsulating region established by the first mold frame with first resin layer resin (first resin) making the first resin height approximately equal to the height of the top of the first mold frame to encapsulate the light emitting elements mounted inside the encapsulating region, a step to form a second mold frame in a manner covering at least part of the first mold frame after hardening the first resin to form the first resin layer, a step to fill the inside of the second mold frame with second resin layer resin (second resin) to a height approximately equal to the height of the top of the second mold frame, and a step to harden the second resin to form the second resin layer. This structure makes it easy to form a layer of first resin with approximately uniform thickness, and makes it possible to emit high quality light with color non-uniformity suppressed.

The light emitting device method of manufacture for another aspect of the present invention can further include a step to prepare a substrate having a layout of conducting material on an insulating planar surface, a step to mount semiconductor light emitting elements on the substrate in a manner making electrical connection with the conducting material and to form a first mold frame around the periphery of the light emitting elements, a step to form a first resin layer in the region established by the first mold frame, a step to form a second mold frame on the upper surface of the first mold frame, and a step to form a second resin layer in the region established by the second mold frame. This structure makes it easy to form a layer of first resin with approximately uniform thickness, and makes it possible to emit high quality light with color non-uniformity suppressed. The above and further objects of the present invention as well as the features thereof will become more apparent from the following detailed description to be made in conjunction with the accompanying drawings.

DETAILED DESCRIPTION OF THE EMBODIMENTS

Figure 1:
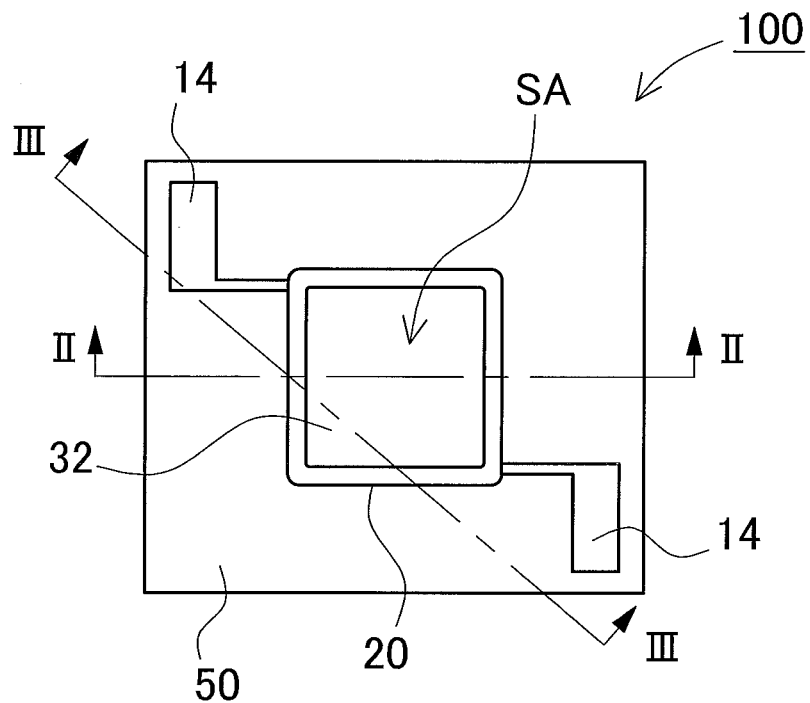
FIG. 1 is a plan view showing a light emitting device for the first embodiment of the present invention.

The following describes implementation modes and embodiments of the present invention based on the figures. However, the following modes of implementation and embodiments are merely specific examples of a light emitting device and its method of manufacture representative of the technology associated with the present invention, and the present invention is not limited to the embodiments described below. Further, components cited in the claims are in no way limited to the components indicated in the embodiments. In the absence of specific annotation, structural component features described in the embodiment such as dimensions, raw material, shape, and relative position are simply for the purpose of explicative example and are in no way intended to limit the scope of the invention. Properties such as the size and spatial relation of components shown in the figures may be exaggerated for the purpose of clear explanation. In the descriptions following, components with the same name and label indicate components that are the same or have the same properties and their detailed description is appropriately abbreviated. Further, a single component can serve multiple functions and a plurality of structural elements of the invention can be implemented with the same component. In contrast, the functions of a single component can be divided among a plurality of components. In addition, explanations used to describe part of one implementation mode or embodiment may be used in other implementation modes or embodiments.

In one mode of implementation of the light emitting device of the present invention, the substrate can have an insulating planar surface, conducting material can be patterned on top of the insulating planar surface, and the semiconductor light emitting elements can be electrically connected to the conducting material.

In another mode of implementation of the light emitting device of the present invention, the first resin layer can include wavelength-shifting material to change the wavelength of light emitted from the semiconductor light emitting elements.

In another mode of implementation of the light emitting device of the present invention, the second resin layer can include light diffusing material to diffuse light emitted from the semiconductor light emitting elements. An encapsulating resin configuration with wavelength-shifting material such as fluorescent material distributed in the first resin layer to change the wavelength, and light diffusing material distributed in the second resin layer to reduce non-uniform light emission (luminance) can produce a light emitting device that outputs a higher quality of light.

In another mode of implementation of the light emitting device of the present invention, boundaries between the bottom edges of the inside surfaces of the first mold frame and the substrate can be positioned inside the bottom edges of the inside surfaces of the second mold frame. This structure gives the inside surfaces of the mold frame an overall inclining shape, and can improve the light extraction efficiency. It also avoids impeded light extraction due to partial coverage of the first resin layer 31 with the second mold frame.

In another mode of implementation of the light emitting device of the present invention, the second mold frame can cover upper and outer surfaces of the first mold frame. With this structure, the mold frame can be formed with the second mold frame covering the first mold frame enabling robust attachment of a large mold frame to the substrate. This can improve reliability.

In another mode of implementation of the light emitting device of the present invention, the walls of the second mold frame can be made wider (when viewed from above) than the walls of the first mold frame. With this structure, the mold frame can be formed with the second mold frame covering upper and outer surfaces of the first mold frame allowing a large mold frame to be robustly attached to the substrate. This can improve reliability.

In another mode of implementation of the light emitting device of the present invention, the viscosity of the resin used to form the first mold frame can be higher than the viscosity of the resin used to form the second mold frame. This configuration can make it easy to form narrow but tall first mold frame walls.

In another mode of implementation of the light emitting device of the present invention, a protection device can be connected with reverse polarity in parallel with the semiconductor light emitting elements, and the protection device can be embedded inside the second mold frame. In this configuration, the viscosity of the resin used to form the second mold frame can be reduced to avoid creating a voided region between the surface of the protection device and the enveloping second mold frame resin. This can improve light emitting device reliability.

In another mode of implementation of the light emitting device of the present invention, the center region of the second resin layer can be formed with approximately the same height as the top of the second mold frame. This configuration allows the heights of the first and second resin layers to be maintained approximately constant even in the vicinity of the mold frame. This has the effect of suppressing color non-uniformity for light emitted in the vicinity of the mold frame where prior art devices have a tendency to emit non-uniform colors.

In another mode of implementation of the light emitting device of the present invention, the height of the center region of the second resin layer can be formed higher than the top of the second mold frame. This configuration has the effect of increasing light (luminous) flux with the second resin layer.

In another mode of implementation of the light emitting device of the present invention, the wavelength-shifting material can be fluorescent material that is excited by light emitted by the semiconductor light emitting elements.

In another mode of implementation of the light emitting device of the present invention, the first resin layer can include a fluorescent material layer and a light-transmitting resin layer formed above the fluorescent material layer. In this structure, fluorescent material can be settled towards the bottom of the first resin layer making it easy to efficiently capture and shift the wavelength of light from the semiconductor light emitting elements.

First Embodiment

Figure 2:
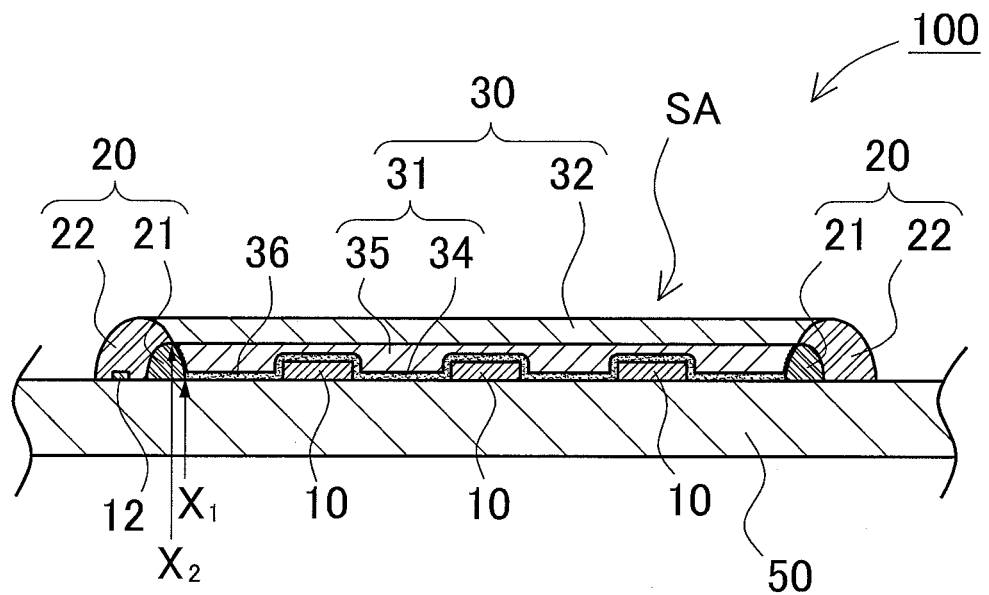
FIG. 2 is a cross-section through the line II-II in FIG. 1.
Figure 3:
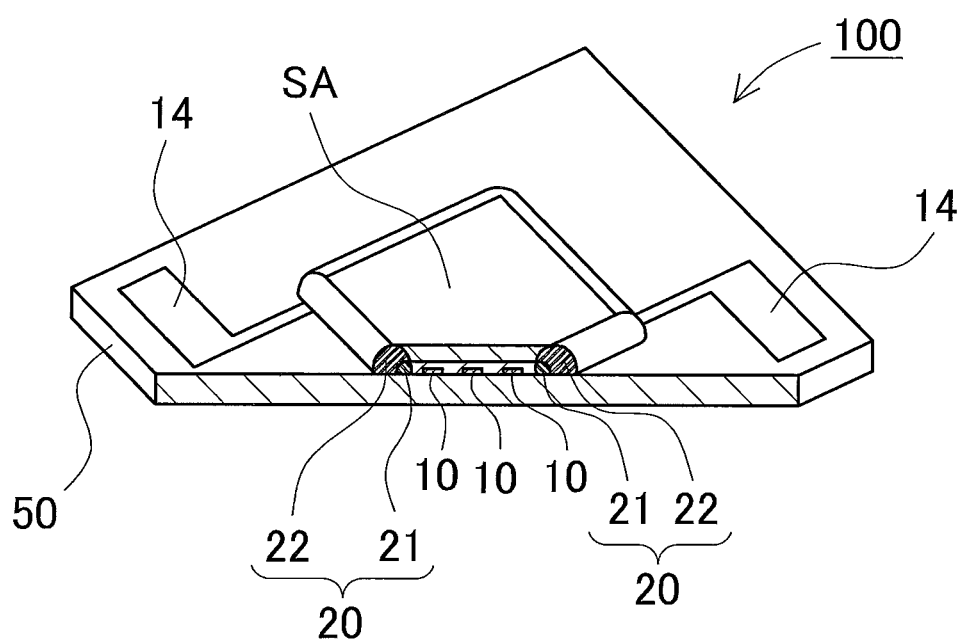
FIG. 3 is an oblique view in cross-section at the line III-III in FIG. 1.

A plan view of a light emitting device 100 for the first embodiment of the present invention is shown in FIG. 1, a cross-section through the line II-II is shown in FIG. 2, an oblique view in cross-section at the line is shown in FIG. 3, and the process steps for manufacturing the light emitting device 100 is shown in the schematic cross-sections of FIGS. 4A-4D. The light emitting device 100 shown in these figures is provided with a substrate 50, light emitting elements 10 mounted on the substrate 50, a mold frame 20 made of resin on top of the substrate 50 surrounding the periphery of the semiconductor light emitting elements 10, and resin layers 30 that fill the encapsulating region SA established by the mold frame 20.

The substrate has an insulating planar surface with conducting material patterned on top of the insulating planar surface. Circuit connections are implemented by electrically connecting the semiconductor light emitting elements to the conducting material.

Figure 5:
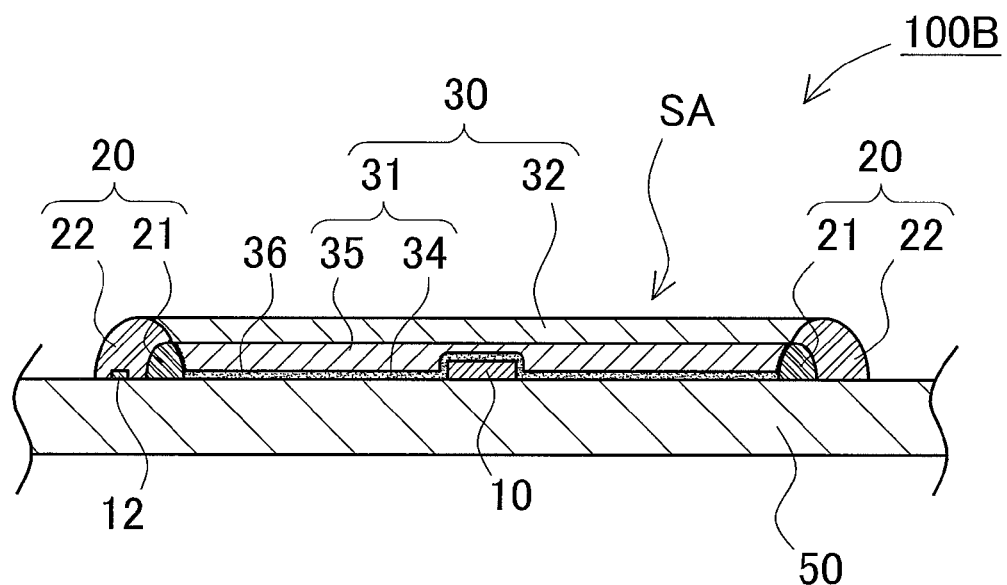
FIG. 5 is a schematic cross-section showing an alternative example of a light emitting device.

Here, the substrate 50 has a rectangular shape and the mold frame 20 also has a rectangular shape. One or more semiconductor light emitting elements 10 are mounted in the encapsulating region SA surrounded by the mold frame 20. Here, a plurality of light emitting elements 10 is disposed as a row and column array inside the rectangular encapsulating region SA. In this example, six rows and six columns (for a total of 36 elements) of semiconductor light emitting elements are mounted in the encapsulating region SA. However, alternate layouts can be employed that have an arbitrary number of light emitting elements in an arbitrary pattern. For example, the number of rows and columns can be changed to produce long narrow rectangular shapes, and circular or polygonal layouts can also be employed. Further, as shown by the light emitting device 100B of the alternative example in FIG. 5, a single light emitting element 10 can also be used.

(Semiconductor Light Emitting Element 10)

Elements such as light emitting diodes (LEDs) and semiconductor laser diodes can be used as the semiconductor light emitting elements 10. Semiconductors such as ZnS, SiC, GaN, GaP, InN, AlN, ZnSe, GaAsP, GaAlAs, InGaN, GaAlN, AlInGaP, and AlInGaN can be formed as a light emitting layer on a substrate via methods such as liquid-phase epitaxy, hydride vapor-phase epitaxy, and metal organic chemical vapor-phase deposition (MOCVD), and used with good results as light emitting elements 10. By selecting the semiconductor layer material and its degree of poly-crystallization, various semiconductor light emitting elements can be fabricated that emit light from ultraviolet to infrared wavelengths. In particular, when light emitting elements are employed in display devices suitable for outdoor use, high luminance emission is essential. Accordingly, it is preferable to select nitride semiconductors as light emitting element material that can emit with high luminance at green and blue wavelengths. For example, semiconductors such as $In_xAl_yGa_{1-x-y}N$, ($0 \leq x \leq 1$, $0 \leq y \leq 1$, $x+y \leq 1$) can be used as light emitting layer material. Light emitting elements can also combine these types of semiconductor materials with various fluorescent materials 36 (described in detail later), which are excited by the emitted light and re-emit (fluoresce) at a different wavelength. For light emitting element material that emits at red wavelengths, it is preferable to select gallium-aluminum-arsenide system semiconductors or aluminum-indium-gallium-phosphide system semiconductors. For color display devices, it is preferable to combine LED chips that emit red wavelengths from 610 nm to 700 nm, chips that emit green wavelengths from 495 nm to 565 nm, and chips that emit blue wavelengths from 430 nm to 490 nm.

Each light emitting element 10 is mounted on the substrate 50 via solder balls or bumps in "flip-chip" manner with the electrode-side face-down and the primary light extraction surface (non-electrode-side) face-up. However, light emitting element structure is not limited to this configuration, and electrodes can also be established on the primary light extraction surface side, which is the reverse side from the surface mounted on the substrate.

(Protection Device 12)

Preferably, a protection device 12 is connected with the light emitting elements 10. The protection device 12 prevents semiconductor light emitting element 10 damage when a reverse bias voltage is applied. A component such as a Zener diode connected with reverse polarity in parallel with the light emitting elements can be used with good results as a protection device 12. A device such as varistor can also be used as the protection device 12. The protection device 12 and interconnect runs patterned on the substrate 50 are embedded in the resin mold frame 20 (described in detail later). In this manner, the protection device 12 and interconnect runs can be protected by the mold frame 20 without establishing a special purpose protection layer. Namely, the mold frame 20 can also serve as a protection layer for the protection device 12 and interconnect runs.

(Substrate 50)

An insulating substrate with superior heat dissipating properties can be suitably used as a substrate 50. For example, a ceramic substrate can be used, and an alumina substrate can be used as an example of a ceramic substrate. In addition, glass epoxy substrates and aluminum nitride substrates can also be used appropriately. As shown in the plan view of FIG. 1, the mold frame 20 that defines the encapsulating region SA is formed approximately in the center of the substrate 50, and connecting terminals 14 for external electrical connection are established outside the mold frame 20. A pair of external connecting terminals 14 that include a positive and negative terminal is formed, and each external connecting terminal 14 is electrically connected via interconnect runs to the light emitting elements 10 (and protection device 12) mounted in the encapsulating region SA. In the example of FIG. 1, positive and negative external connecting terminals are formed by printing along extensions of a diagonal line across the rectangular mold frame 20. Although the external connecting terminals here are a single pair of terminals, they are not limited to that configuration and the external connecting terminals can also be two or more pairs of terminals.

(Resin Layers 30)

The resin layers 30 include a first resin layer 31, and a second resin layer 32 formed on top of the first resin layer 31. The first resin layer 31 includes wavelength-shifting material, and embeds the light emitting elements 10 in resin. The second resin layer 32 includes light diffusing material that diffuses light emitted by the light emitting elements 10 and light shifted in wavelength by the wavelength-shifting material to mix the colors and produce uniform light output.

(Mold Frame 20)

The mold frame 20 includes a first mold frame 21 formed with first mold frame resin, and a second mold frame 22 formed with second mold frame resin. Although described in detail later, this makes it easy to laminate first and second resin layers 31, 32 with uniform thickness, and makes it possible to obtain high quality light emission with suppressed color non-uniformity.

(First Resin Layer 31)

As shown in FIG. 2, the first resin layer 31 includes a wavelength-shifting layer 34, and a light-transmitting resin layer 35 formed on top of the wavelength-shifting layer 34. Accordingly, when the first resin layer 31 is formed, wavelength-shifting material is incorporated into the light-transmitting resin that forms the first resin layer 31. When the first mold frame 21 is filled with resin for the first resin layer 31, wavelength-shifting material added to the light-transmitting resin sinks under its own weight, and the wavelength-shifting layer 34 is formed by wavelength-shifting material preferentially settled at the bottom of the first resin layer 31. The light-transmitting resin layer 35 is formed in the upper part of the first resin layer 31 that is sparsely populated by wavelength-shifting material. This structure enables wavelength-shifting material to be effectively distributed around and on top of the semiconductor light emitting elements 10, and allows light emitted by the semiconductor light emitting elements 10 to be efficiently shifted in wavelength. Resins such as silicone can be used with good results as the light-transmitting resin for this type of first resin layer.

(Fluorescent Material 36)

Fluorescent material 36, which is excited by light emitted from the semiconductor light emitting elements 10, can be suitably used as the wavelength-shifting material. Phosphors such as $Y_3Al_5O_{12}$ (YAG), $CaAlSiN_3$ (CASH), and $(Sr_xCa_{1-x})AlSiN_3$ (S-CASN) can be used with good results as the fluorescent material 36. For example, by using an InGaN LED semiconductor light emitting element 10 with rare earth element activated YAG fluorescent material 36, blue light from the LED and wavelength-shifted yellow light from the fluorescent material, which fluoresces due to blue light excitation, can mix to produce white light. This system can be employed to realize a white light emitting device. Depending on requirements, a plurality of different types of fluorescent materials can be mixed together. For example, material that fluoresces at red wavelengths can be added to (a white light emitting device) obtain light emission with additional warm color (i.e. red, orange, and yellow) components. It is also possible to produce light output that has a color other than white. Using an LED that emits blue light with a peak wavelength of 445 nm to 455 nm, a mixture of YAG fluorescent material that fluoresces yellow when excited by blue light, lutetium-aluminum-garnet (LAG, $Al_5Lu_3O_{12}$) fluorescent material that fluoresces yellow-green, and S-CASN fluorescent material that fluoresces red, a light emitting device can be realized that outputs a color mix producing light-bulb-color white light.

The fluorescent material 36 can be preferentially distributed at the bottom of the first resin layer 31. This allows the fluorescent material 36 to be disposed close to the semiconductor light emitting elements 10, and enables light emitted from the light emitting elements 10 to efficiently shine on the fluorescent material 36 to shift the wavelength. This type of fluorescent material 36 distribution can be established, for example, by forming the first resin layer 31 with fluorescent material 36 mixed into the resin and allowing natural sedimentation of the fluorescent material 36 (due to its own weight) to occur prior to resin hardening. As a result, after resin solidification, a region that includes a large amount of fluorescent material 36 is formed at the bottom of the first resin layer 31.

Figure 8:
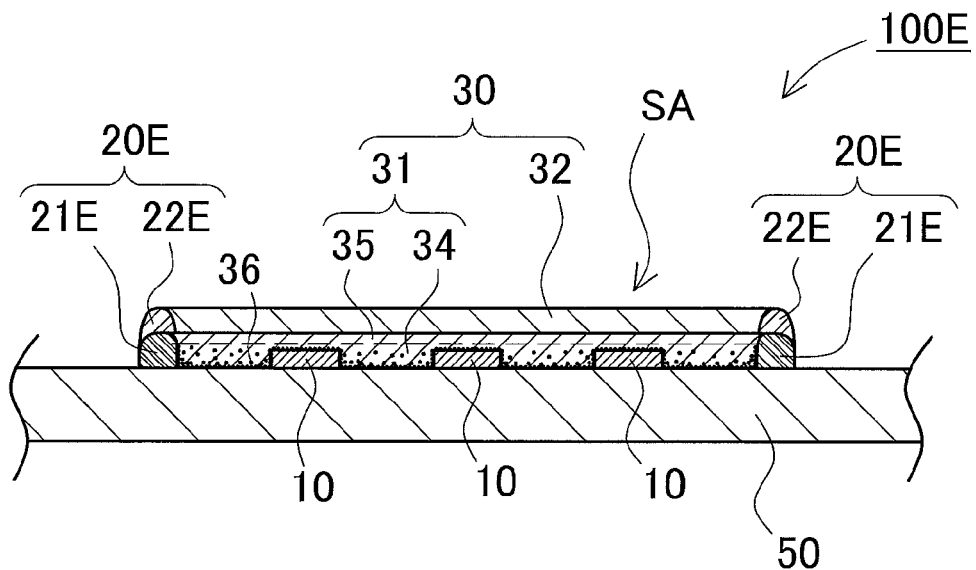
FIG. 8 is a schematic cross-section showing another alternative example of a light emitting device.

For purposes of explanation, in the light emitting device 100 example shown in FIG. 2, the first resin layer 31 is illustrated as a separate wavelength-shifting layer 34 that includes fluorescent material and a light-transmitting resin layer 35 that does not include fluorescent material. In actuality however, the border between the wavelength-shifting layer 34 and the light-transmitting resin layer 35 is indistinct. Fluorescent material sedimentation varies depending on the viscosity of the resin and the particle size and density of the fluorescent material. For example, the present invention includes the situation shown in the light emitting device 100E for the alternative example in FIG. 8. Here, the density of fluorescent material 36 increases to the degree that the bottom of the first resin layer 31 is approached, and conversely decreases to the degree that the top of the first resin layer 31 is approached. The first resin layer 31 in FIG. 8 is made up of a wavelength-shifting layer 34 that has fluorescent material 36 sediment, and a light-transmitting resin layer 35, which for practical purposes, does not include fluorescent material 36. In the present patent application, the meaning of "for practical purposes does not include fluorescent material" naturally incorporates the case where absolutely no fluorescent material is included, but also incorporates the case where even though trace amounts of fluorescent material particulates may be included, absorption of light emitted by the semiconductor light emitting elements cannot be confirmed.

(Second Resin Layer 32)

The second resin layer 32 is formed on top of the first resin layer 31. Light diffusing material is included in the second resin layer 32. This structure allows light emitted from the LED, and emitted light shifted in wavelength by the fluorescent material 36 to be diffused by the second resin layer 32 to produce uniform light. Resins such as silicone resin can be used with good results for the second resin layer. Filler material can be used as the light diffusing material. In the first embodiment, dimethyl silicone resin is used for the second resin layer, and $TiO_2$ powder is mixed into the resin as filler.

In this manner, part of the first resin layer 31 functions as a wavelength-shifting layer 34 that changes the wavelength of light emitted by the semiconductor light emitting elements 10. The second resin layer 32 functions as a light diffusing layer that diffuses light emitted by the semiconductor light emitting elements 10 as well as light shifted in wavelength, and mixes all the colors together uniformly. By separating the resin layers 30 into two layers and allocating a wavelength-shifting function to one layer and a light diffusing function to the other layer, those functions can be efficiently executed in each respective layer making it possible to obtain uniform light output.

Figure 4A:
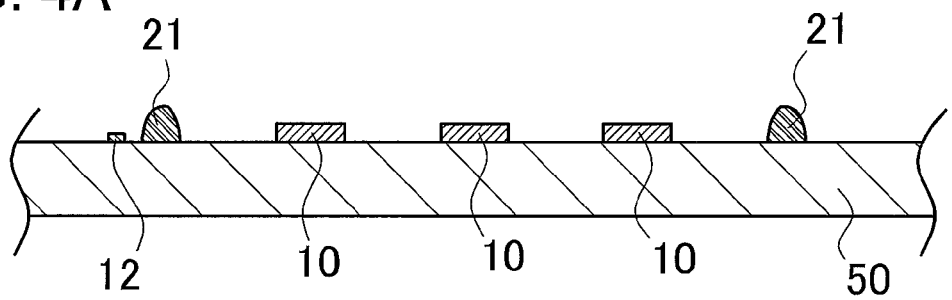
FIGS. 4A-4D are schematic cross-sections showing the process steps for manufacturing the light emitting device of FIG. 1.
Figure 4B:
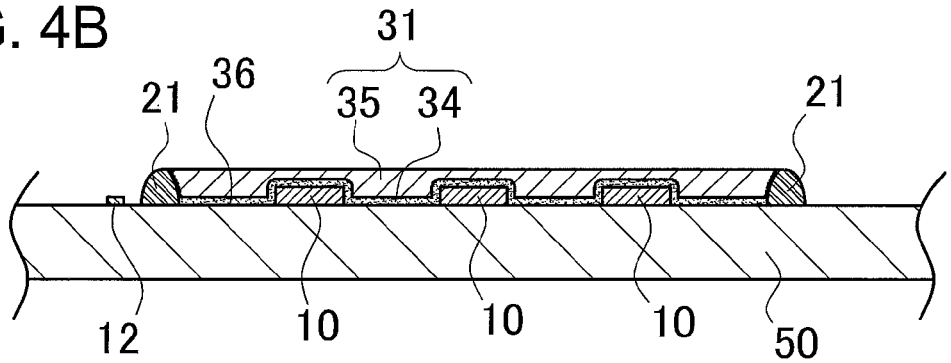
Figure 14:
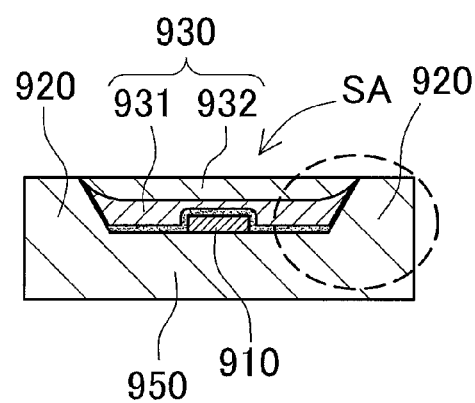
FIG. 14 is a cross-section showing a related art light emitting device.
Figure 15:
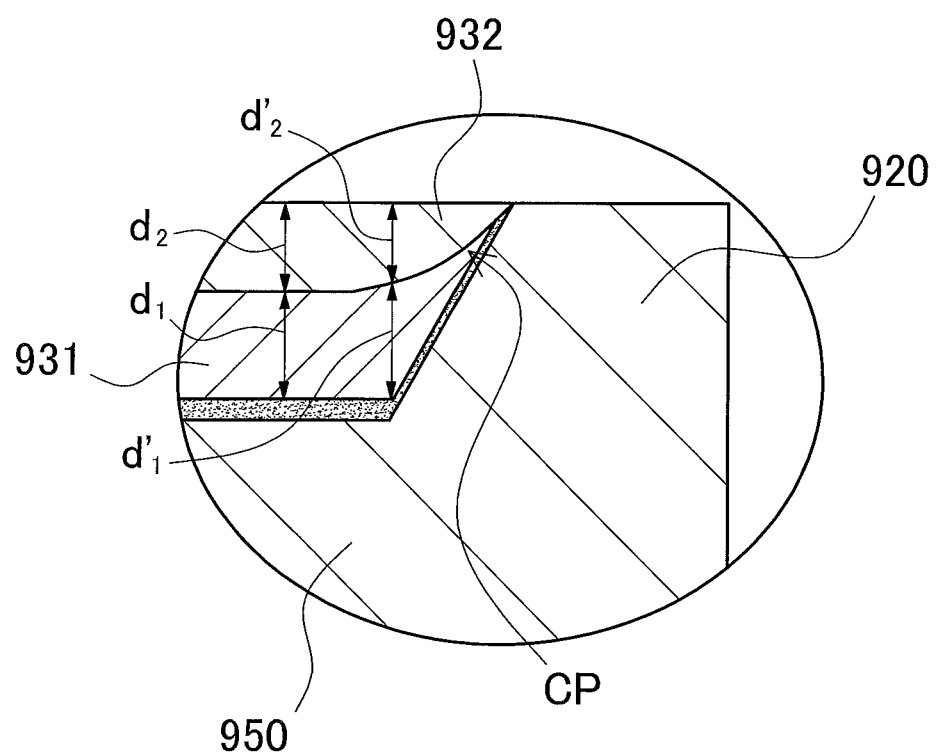
FIG. 15 is an enlarged cross-section of the interface region between the mold frame and the resin layers of the light emitting device in FIG. 14.

Here, it is desirable to form the first resin layer 31 with its upper surface essentially in the same plane as the top of the first mold frame 21. As shown in FIGS. 4A and 4B, after first mold frame 21 formation when the first mold frame 21 is filled with resin to form the first resin layer 31, the first resin is filled to a plane approximately at the top of the first mold frame 21. As shown in FIG. 14, when a mold frame is filled with resin in two stages according to related art methods, it is necessary to suspend resin filling when the first resin level reaches an intermediate height on the mold frame 920. This results in first resin creeping up the sides of the mold frame 920 due to surface tension. As shown in FIG. 15, when the mold frame 920 is filled with second resin after hardening the first resin layer, the second resin layer 932 becomes quite thin (relative to the first resin layer) in the vicinity of the mold frame 920, and the amount of second resin layer 932 thinning in the vicinity of the mold frame 920 is equivalent to the amount of inevitable thickening (due to surface tension) of the first resin layer 931 in that region. As a result, light diffusing properties of the second resin layer 932 are diminished in the vicinity of the mold frame 920, and in particular, color non-uniformity in light output around the perimeter of the resin layers generates a color-shifted ring around the perimeter.

Figure 4C:
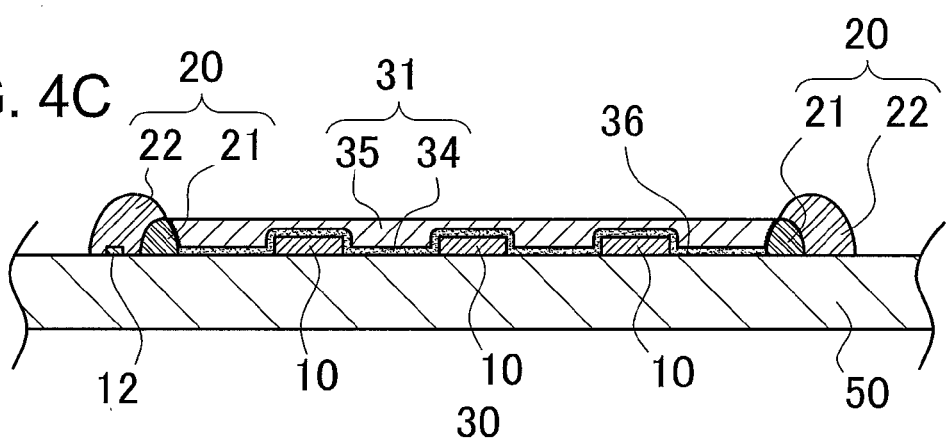
Figure 4D:
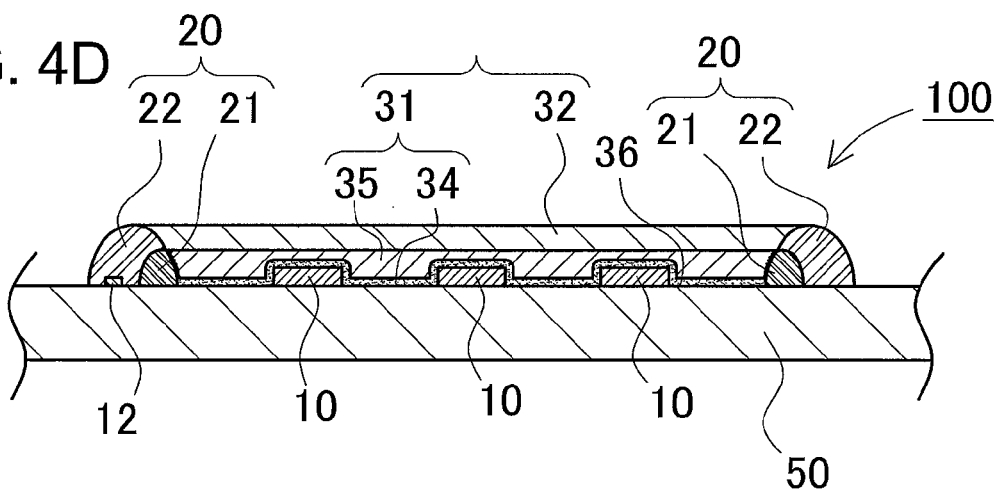

By forming the mold frame 20 of the light emitting device 100 for the first embodiment in two stages, surface tension effects are controlled to keep resin from creeping up the sides of the mold frame. Specifically, as shown in FIG. 4A, initially the first mold frame 21 is formed with a height corresponding to the thickness of the first resin layer 31. As shown in FIG. 4B, when the encapsulating region SA is filled with first resin, the first resin layer 31 can fill up to the top of the first mold frame 21. Therefore, the first resin layer 31 is formed with approximately uniform thickness over the entire encapsulating region SA including regions adjacent to the first mold frame 21. As shown in FIG. 4C, by forming the second mold frame 22 after solidifying the first resin layer 31, a mold frame 20 of the desired height can be established, and this allows the second resin layer 32 to be formed as shown in FIG. 4D. Accordingly, a plurality of resin layers can be formed with uniform thickness and color non-uniformity can be suppressed.

In this manner, first resin layer 31 and second resin layer 32 thickness can be maintained approximately constant even in the vicinity of the mold frame 20, and color non-uniformity prone to occur near the mold frame in prior art devices can be controlled.

However, in this patent application, the top of the mold frame does not necessarily mean the absolute highest point on the mold frame, but rather points to the part of the mold frame at essentially the same height as the surface of the liquid resin, where the resin does not (for practical purposes) creep up the sides of the mold frame when the encapsulating region delineated by the mold frame is filled with resin. Said differently, the top of the mold frame indicates the height of the part of the mold frame that delineates the region filled with resin. For example, the present invention also includes mold frame configurations where parts of the mold frame that are unrelated to resin filling, such as outside surfaces of the mold frame separated from the encapsulating region, project upward.

Figure 7:
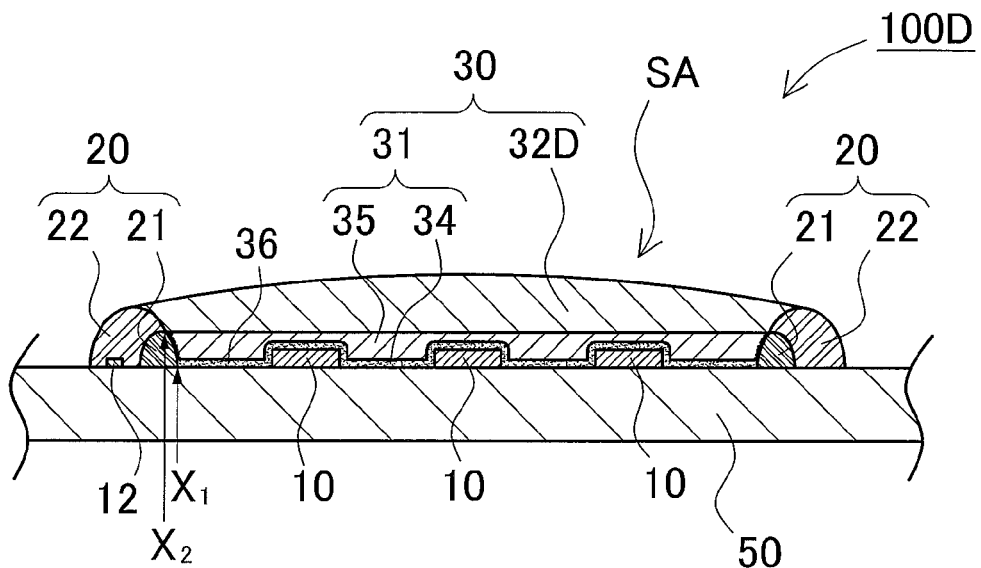
FIG. 7 is a cross-section of a light emitting device for another alternative example.

In examples such as that shown in FIG. 2, the upper surface of the second resin layer 32 is planar. Specifically, the second resin layer 32 is formed with a height approximately equal to the height of the top of the second mold frame 22, and that height is the same from the edges to the center region. However, the present invention is not limited to that structure. For example, the second resin layer 32 can also be formed with an upper surface having a center region height that exceeds the height of the top of the second mold frame 22. This type of structure is shown in the alternative example cross-section of FIG. 7. The upper surface of the second resin layer 32D of this light emitting device 100D is formed with curvature that makes the center region protrude upward. This configuration reduces the loss of output light due to total internal reflection at the air-resin interface, and increases the luminous flux.
(Mold Frame 20)

The following describes the mold frame 20. It is preferable to form the mold frame 20 with white (hue) resins to increase its reflectivity. Further, the mold frame 20 is formed with a dome shaped cross-section for simple fabrication on the substrate 50. In particular, to reflect and shine output light upward at interior surfaces, it is preferable to form the inside of the mold frame 20 with inclined surfaces that widen the enclosed (encapsulating region SA) surface area in the upward direction.

The mold frame 20 is formed with a first mold frame 21 and a second mold frame 22. The first mold frame 21 is fabricated on top of the substrate 50 to establish the encapsulating region SA that surrounds the periphery of the semiconductor light emitting elements 10. First resin is introduced into the encapsulating region SA delineated by the first mold frame 21. Namely, the first mold frame 21 is used as a barrier delineating the area for first resin filling. For this type of first mold frame 21 configuration, a resin is used that has superior adhesion to the substrate 50 as well as superior adhesion to the first resin. Resins such as silicone resin and epoxy resin can be used with good results as this type of first mold frame resin.
(Second Mold Frame 22)

The second mold frame 22 is formed on top of the first mold frame 21. The second mold frame 22 becomes the enclosing barrier to fill second resin over the surface of the solidified first resin layer 31. Accordingly, a resin that has superior adhesion to the first mold frame 21 as well as superior adhesion to the second resin is selected for use as the resin for forming the second mold frame 22. Preferably, the same type of resin used for the first mold frame is used for the second mold frame. However, resin with a lower viscosity than that of the first mold frame is desirable (described in detail later). Resins such as silicone resin and epoxy resin can be used with good results as this type of second mold frame resin. Further, when viewed from above (in a plan view), the second mold frame 22 is made wider than the first mold frame 21. As shown in figures such as FIGS. 4C and 4D, the second mold frame 22 is formed covering exposed upper and outer surfaces of the first mold frame 21.

Covering those upper and outer surfaces with the second mold frame 22 makes it easy to form moderately inclined surfaces around the open region inside the mold frame 20 (compared to covering only the upper surface of the first mold frame 21 as shown in the alternative example light emitting device 100E in FIG. 8). By inclining the surfaces around the open region, light emitted from the light emitting elements 10 can easily shine outward by reflecting off the inclined surfaces, and this can improve light extraction efficiency.

Further, it is desirable to form the interface between the first mold frame 21 and the second mold frame 22 in a continuous manner. This suppresses thickness variation in the first and second resin layers 31, 32 at the interface between the first and second mold frames 21, 22, and enables high quality light to be output.

Figure 9:
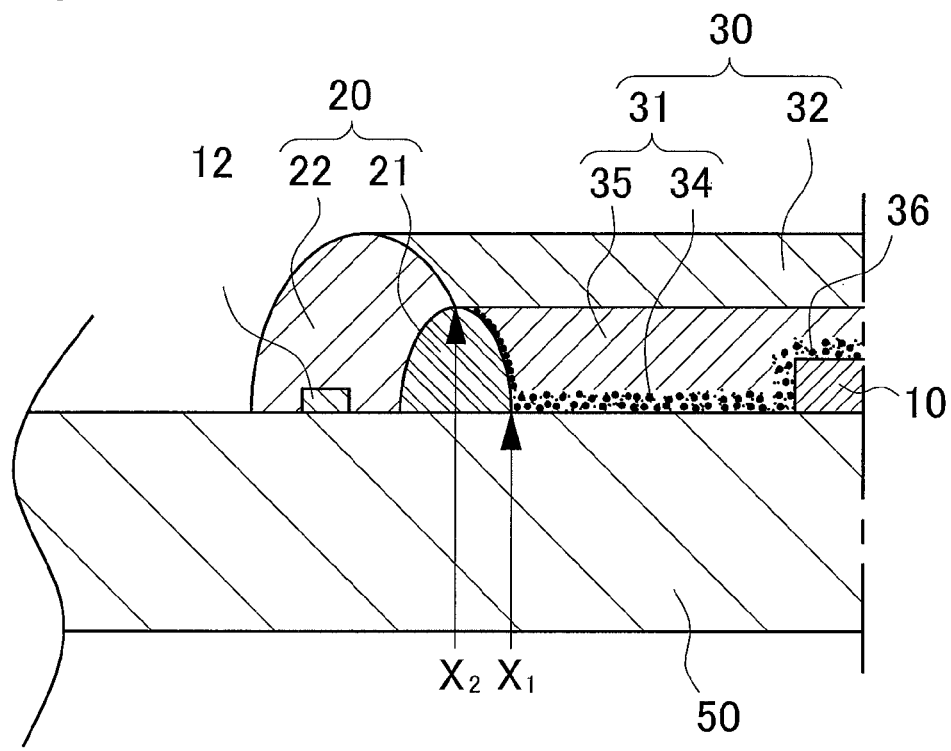
FIG. 9 is an enlarged cross-section of a critical part of the light emitting device shown in FIG. 2.

As shown in the enlarged cross-section of FIG. 9, it is desirable to form the interface with the second mold frame 22 in a manner continuously following the interface between the first mold frame 21 and the first resin layer. Specifically, it is preferable to form the second mold frame 22 with the position of the bottom edge of the second mold frame 22 $x_2$ slightly offset from the bottom edge of the first mold frame 21 $x_1$ towards the outside of the mold frame 20. This configuration avoids covering the first resin layer 31 with the bottom edge of the second mold frame 22, and averts loss in light output. In addition, this configuration forms the inside surfaces of the mold frame 20 as inclined surfaces making it easy to reflect light output from this region in the outward direction.

If the second mold frame 22 is formed only over the upper surface of the first mold frame 21, namely without making contact with the substrate 50, as shown in FIG. 8, the contact area of the second mold frame 22 to the first mold frame 21 is limited by the narrowness of the first mold frame 21 and the connection is not robust. Therefore, as shown in FIGS. 2 and 4C, the second mold frame 22 is made wider than the first mold frame 21 and is layered over the first mold frame 21 covering its exposed (upper and outer) surfaces. With this configuration, the second mold frame 22 is anchored to the substrate 50 over a wide area to increase adhesion strength and improve reliability.

Also at this process step, it is preferable to embed the protection device 12 in the resin that forms the second mold frame 22. By making the viscosity of the resin for the second mold frame lower than the viscosity of the resin for the first mold frame, the protection device 12 can be reliably encapsulated and protected inside the mold frame 20. Said differently, by making the first mold frame resin higher viscosity than the second mold frame resin to make the second mold frame resin relatively malleable, the second mold frame resin can easily conform to the surface topology of the protection device and achieve improved encapsulation reliability (described in detail later).

Figure 10:
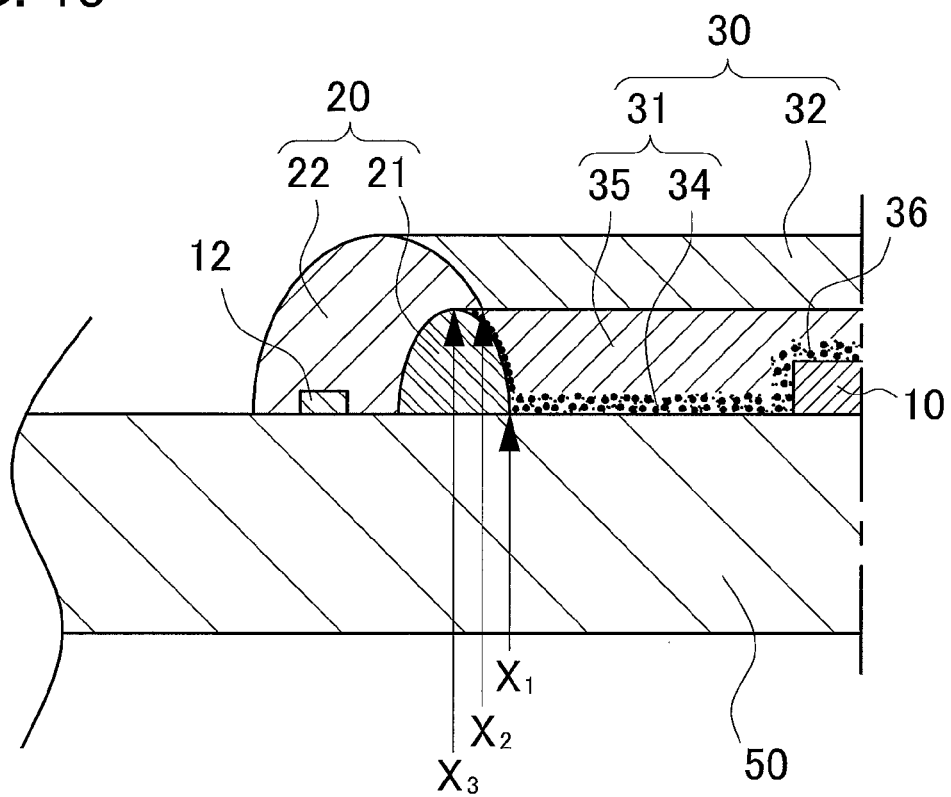
FIG. 10 is an enlarged cross-section of a critical part of the light emitting device for an alternative example.

As shown in the alternative example light emitting device in the enlarged cross-section of FIG. 10, the second mold frame 22 can also be configured to not only cover the first mold frame 21 but also cover part of the edge of the first resin layer 31. Specifically, the position of the bottom edge of the second mold frame 22 $x_2$ can be offset further into the encapsulating region SA than the position of the interface between the first resin layer 31 and the (top of the) first mold frame 21 $x_3$. Although this configuration generates some light loss due to the edges of the first resin layer 31 that are covered by the second mold frame 22, it can constrain overall mold frame width for size reduction, and it can slightly reduce the surface area of the encapsulating region SA, which has merit in making it easier to concentrate light for secondary optics.

(Resin Viscosity)

The viscosity of the resin for each mold frame can be adjusted to an appropriate value by varying the proportions of the component materials that are mixed to make the resin. Here, dimethyl silicone resin is used for both the first and second mold frames, and the viscosity is adjusted according to the mixing ratio of high viscosity resin and low viscosity resin.

Figure 11:
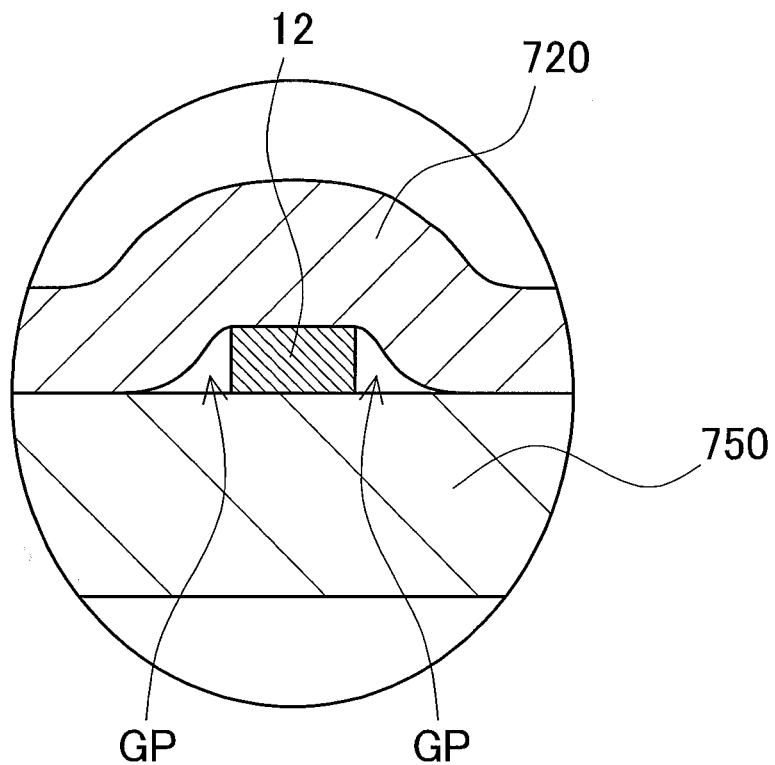
FIG. 11 is a schematic cross-section showing a protection device embedded in high viscosity resin.

By increasing the viscosity of the resin for the first mold frame, it can be formed with a narrow structure having the required height. From the standpoint of reducing device size, making the mold frame 20, which does not contribute to light emission, as narrow as possible can be considered desirable. However, if it is attempted to embed the protection device in high viscosity resin, it becomes problematic to completely fill small gap regions around the protection device with resin that lacks fluidity. As shown in FIG. 11 for example, when the upper surface of a protection device 12 mounted on a substrate 750 is embedded in resin 720, it is possible to generate voids GP between the resin 720 and the substrate 750 in regions around the outside of the protection device 12. These type of voids GP make it easy for ambient air to ingress, and malfunction due to moisture and/or corrosive gases in the ambient becomes a concern.

By embedding the protection device 12 in the resin for the second mold frame and by making the viscosity of the resin for the second mold frame lower than that of the first mold frame, a structure can be achieved that embeds the protection device in the second mold frame 22 with resin reliability filling regions around the perimeter of the protection device 12. With this structure, the viscosity of the first mold frame 21 resin can be increased and the first mold frame 21 can be made narrow, while the protection device 12 can be embedded in the second mold frame 22 with little voiding. Further, by making the first mold frame 21 narrow, exposed regions of the first mold frame 21 can be easily covered by the second mold frame 22 and the effect of constraining overall mold frame 20 width can be achieved.

Figure 6:
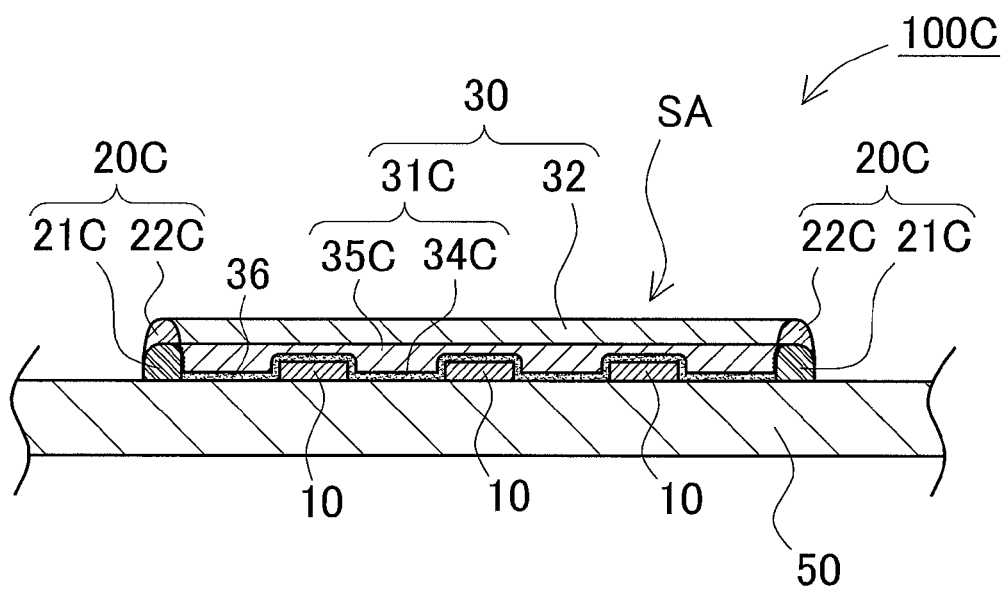
FIG. 6 is a cross-section of a light emitting device for another alternative example.

The present invention is not limited to the structure shown in FIG. 2, and structures shown in the alternative example light emitting devices 100C, 100E of FIGS. 6 and 8 are also possible. In these alternative examples, the mold frames 20C, 20E are configured with second mold frames 22C, 22E layered on top of the upper surfaces of the first mold frames 21C, 21E. In particular, the configurations in FIGS. 6 and 8 can be used advantageously for applications that strive for compactness with a high degree of mold frame narrowing.

Figure 12:
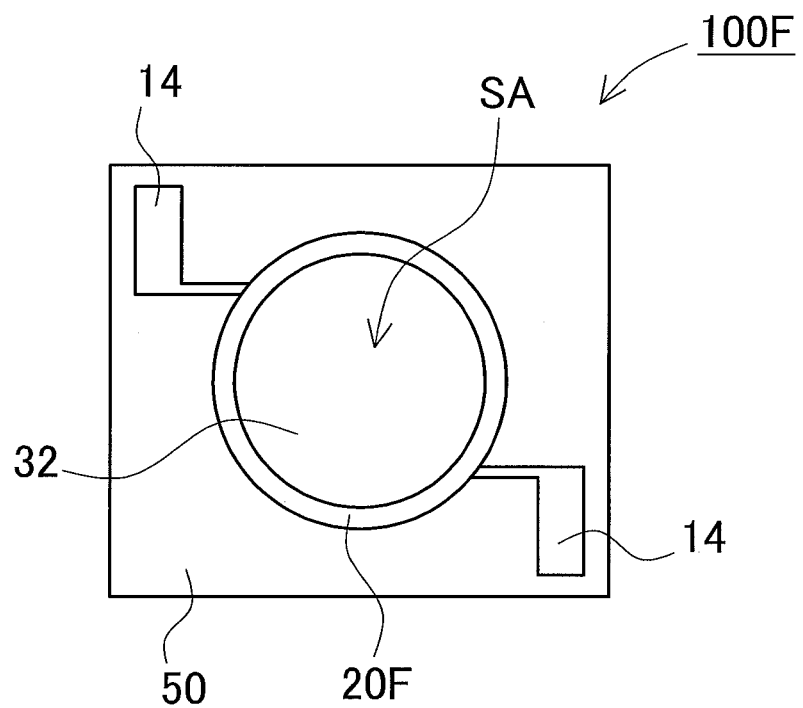
FIG. 12 is a plan view of a light emitting device for an alternative example.

In addition, although the mold frame 20 for the embodiment described above is formed in a square pattern as shown in the plan view of FIG. 1, the present invention is not limited to that configuration. For example, the mold frame 20 layout can have a rectangular shape, a polygonal shape such as hexagonal or octagonal (not limited to rectangular), a shape with truncated corners, a race-track shape, a circular shape, an elliptical shape, or the shape of any arbitrary closed curve. The shape of the mold frame is designed considering specifications such as the required amount of light output and pattern of illumination, the required number of semiconductor light emitting elements 10, and the light emitting element mounting pattern. For example, FIG. 12 shows a light emitting device 100F with the mold frame 20F formed in a circular pattern. Use of this type of circular pattern can make it easy to modify the previously described second resin layer into a lens shape.

The embodiment above describes an example of a light emitting device with semiconductor light emitting elements 10 mounted on a substrate 50, namely the embodiment is an example of chip-on-board (COB) or direct chip attachment technology. However, the present invention is not limited to the structure described above and can also be applied to chip-type (chip-scale) light emitting devices.

(Light Emitting Device 100 Manufacturing Method)

The following describes the method of fabricating the light emitting device 100 for the first embodiment based on FIGS. 4A-4D. First, as shown in FIG. 1A, semiconductor light emitting elements 10 and a protection device 12 are mounted on a substrate 50 pre-patterned with interconnect runs by a method such as printing, and the first mold frame 21 is formed with first resin surrounding the periphery of the semiconductor light emitting elements 10. Either semiconductor device mounting, or first mold frame 21 formation can be performed first. For example, when semiconductor light emitting element and protection device mounting is performed in a high temperature environment such as in solder reflow, the semiconductor devices are mounted first and the first mold frame 21 is formed subsequently. This avoids melting or damaging the first mold frame resin during semiconductor light emitting element and protection device mounting.

Next, with the first mold frame 21 solidified as shown in FIG. 4B, the first resin layer 31 is formed by filling the encapsulating region SA inside the first mold frame 21 with first resin. Here, first resin is filled to a height approximately equal to the height of the first mold frame 21. This avoids surface tension effects that cause the first resin to creep up the inside surfaces of the mold frame 20. Accordingly, the first resin layer 31, and the second resin layer 32 subsequently formed on top of the first resin layer 31, can be formed with uniform thickness to avoid color non-uniformity in the output light. Further, the first resin has wavelength-shifting material mixed into the resin. When the inside of the first mold frame 21 is filled with first resin, the included wavelength-shifting material sinks under its own weight to form the first resin layer 31 with a wavelength-shifting layer 34 and a light-transmitting resin layer 35.

After solidifying the first resin to form the first resin layer 31, the second mold frame 22 is formed as shown in FIG. 4C. The second mold frame 22 is formed covering upper and outer surface regions of the first mold frame 21 that are exposed on top of the substrate 50. Further, the second mold frame 22 is formed with its inside surface bottom edge further to the outside of the mold frame 20 than the position of the interface of the first mold frame 21 inside surface bottom edge with the substrate 50. This allows lamination of second resin over the upper surface of the first resin layer 31 in an essentially continuous manner even at the interface between the first and second mold frames 21, 22. Accordingly, the second resin layer 32 formed by the second resin can be made with approximately uniform thickness over its entire surface area. When the first mold frame 21 is covered with the second mold frame 22, the protection device 12 is also buried and protected under the second mold frame 22.

Finally, with the second mold frame resin solidified, the encapsulating region SA inside the second mold frame 22 is filled with second resin to form the second resin layer 32. Filling second resin to a height approximately equal to the height of the second mold frame 22 can achieve a uniformly thick layer by again avoiding surface tension effects. Light diffusing material is mixed into the second resin, and light emitted from the first resin layer 31 by the semiconductor light emitting elements 10 as well as light shifted in wavelength by the wavelength-shifting material is scattered and diffused by the light diffusing material to emit light with uniformly mixed colors normal to the surface of the encapsulating region SA. Solidification of the second resin to form the second resin layer 32 completes fabrication to produce a light emitting device 100 with light emitting elements 10 encapsulated within the encapsulating region SA. By establishing the first resin layer 31 and the second resin layer 32 with approximately uniform thickness over the entire area, output light color non-uniformity is suppressed particularly in the vicinity of the mold frame 20. This makes high quality light emission possible.

As described above for the present embodiment, dividing the encapsulating resin into a first resin layer, where wavelength-shifting takes place due to inclusion of wavelength-shifting material such as fluorescent material 36, and a second resin layer, which reduces emission of non-uniform light by including light diffusing material, allows a higher quality light emitting device to be produced.

As shown in FIG. 14, an LED light emitting device can adopt a configuration with an LED element 910 mounted inside a package 950. To form two resin layers 930 in this type of structure, initially a first resin layer 931 that includes fluorescent material 36 is formed (molded). Inside this first resin layer 931, light is emitted from the LED element 910, and wavelength-shifted fluorescent light is generated by excitation of the fluorescent material 36 by the LED light. Next, a second resin layer 932 that includes light diffusing material is filled on top of the first resin layer 931. With this structure, light emitted from the LED element 910 and wavelength-shifted fluorescent light re-emitted from the fluorescent material 36 is diffused by the second resin layer 932 to obtain uniform light.

However, a structure with resin layers 930 formed in two stages in this manner has the problem that non-uniform colors are generated particularly in the vicinity of the mold frame 920. Specifically, as shown in the enlarged cross-section of FIG. 15 that zooms in on the broken line region of FIG. 14, resin that forms the first resin layer 931 creeps up adjacent to the side CP of the resin mold frame 920 due to surface tension. When the second resin layer 932 is formed over that topology, the first resin layer 931 is thicker in the region of the mold frame 920 and the second resin layer 932 inevitably becomes thinner in that region. Specifically, in the central part of the encapsulating region SA, the first resin layer 931 has a thickness $d_1$ and the second resin layer 932 has a thickness $d_2$ for a thickness ratio of $R=d_1/d_2$. However, in perimeter areas of the encapsulating region SA, the first resin layer 931 has a thickness $d_1'$ and the second resin layer 932 has a thickness $d_2'$ changing the thickness ratio to $R'=d_1'/d_2'$. As a result, color non-uniformity develops in light emitted from the central part of the encapsulating region SA and light emitted from edges (perimeter areas) of the encapsulating region SA.

In contrast, as previously described for the light emitting device of the present embodiment, the second mold frame is formed after forming the first resin layer containing wavelength-shifting material such as fluorescent material 36. By forming a second resin layer containing light diffusing material to reduce color non-uniformity, a light emitting device can be obtained that produces higher quality light.

To avoid previously described surface tensions effects when encapsulating material is established in two stages in a resin package or laminated ceramic package, structural constraints require the position of the edge of the second encapsulating layer to be separated by a given distance from the edge of the first encapsulating layer. In this case, since the light output area is expanded compared to that for a single encapsulating layer, light emitted from the light emitting elements dispersing over the wider area is a cause of reduced luminous intensity.

In contrast, the second mold frame of the present embodiment is formed after solidifying the first mold frame and first resin layer making it possible to align the edges of the first and second mold frames. This allows the encapsulating material to be formed in two separate layers without expanding the size of the light output area.

The configuration of the present invention is not necessarily limited to disposing wavelength-shifting material such as fluorescent material in the first resin layer. For example, a high luminosity white light source can be obtained by using a first resin layer encapsulating material that includes white filler, and using a second resin layer encapsulating material that includes fluorescent material such as YAG fluorescent material. This type of structure can be particularly effective in lighting equipment that primarily uses the light directly in front of the light emitting device.

Second Embodiment

Figure 13:
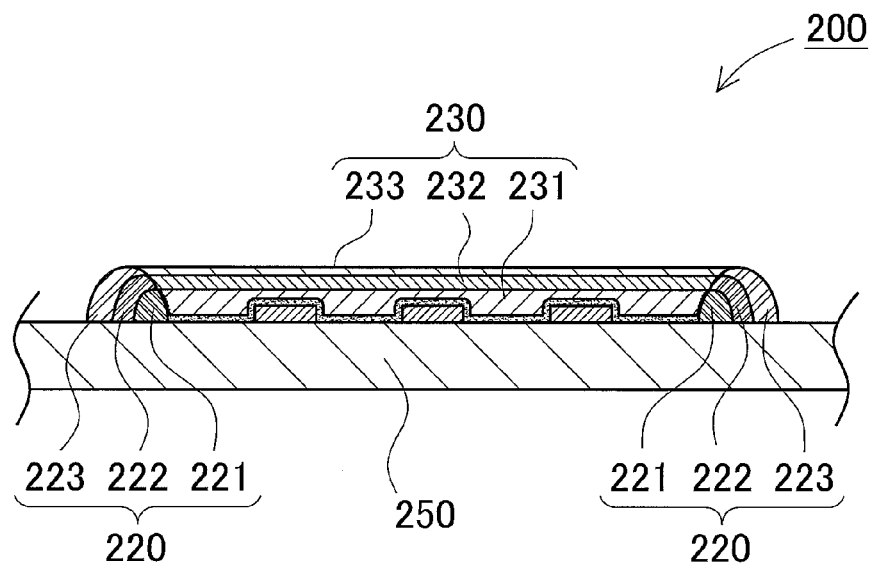
FIG. 13 is a schematic cross-section showing a light emitting device for the second embodiment.

Although an example with a two layer structure is described above, the present invention is not limited to that structure and three or more layers can also be employed. This type of example is shown in FIG. 13 as a light emitting device 200 for the second embodiment. The light emitting device 200 in this figure shows an example of a three layer structure with a first resin layer 231, a second resin layer 232, and a third resin layer 233. Namely, the mold frame 220 is configured with a first mold frame 221, a second mold frame 222, and a third mold frame 223. By layering mold frame 222 components to increase the mold frame 220 height to the resin filling height for each layer prior to resin filling, resin can be filled to a height approximately equal to the top of the mold frame 220 to form each resin layer. This keeps the resin in each resin layer from creeping up inside surfaces of the mold frame 220 due to surface tension, and allows a high quality light emitting device to be produced. This type of multi-layer structure can be advantageously applied to configurations such as a multi-fluorescent layer structure. Specifically, instead of mixing all the fluorescent material into a single layer, it can be divided among layers. This configuration has promise for improving fluorescent material excitation efficiency by utilizing the fluorescent material's absorption and reflection spectra characteristics.

Further, this structure can reduce index of refraction differences between resin layers. For example, in the case where the light emitting elements are mounted in flip-chip manner, light output from each light emitting chip shines through the chip substrate (e.g. sapphire) on which semiconductor layers were formed (e.g. grown or deposited) during chip fabrication. However, there is a refractive index difference between the sapphire chip substrate and the outside of the light emitting device, namely the ambient air. Since total internal reflection can occur when light passes through materials with different indexes of refraction, this can reduce the light extraction efficiency of the light emitting device. By changing the refractive index in stages over the light path through the resin layers from the sapphire chip substrate to the outside of the light emitting device (air), total internal reflection can be suppressed at each layer interface and improved light extraction efficiency can be expected. For example, over the light path interval from the sapphire chip substrate with a refractive index of 1.75 to the air with a refractive index of 1.0, the refractive index can be gradually reduced in the three resin layers from 1.6 to 1.5 to 1.4. This can suppress total internal reflection at each interface with the expectation of increasing the amount of light ultimately extracted from the light emitting device.

In addition, wavelength band-elimination or band-pass filter resin layers can be included to eliminate or pass particular wavelength components of the output light. For example, in applications that use a light emitting device as an illumination source that eliminates certain wavelengths to make skin color look more attractive, resin layers can be provided with the ability to block those wavelengths, or resin layers with that wavelength blocking ability can be added.

For these types of multi-layer structures that are not limited to only two layers and have multiple layers serving various functions, the present invention can be effectively utilized to form each layer with uniform thickness even in the edge regions. Further, resin layers in the multi-layer structures described above do not necessarily have to have planar upper surfaces, but rather they can also be reconfigured with upper surface shapes such as convex and concave.

The light emitting device and method of manufacture of the present invention can be used not only for illumination sources, LED displays, backlight sources, traffic signals, illuminated switches, and semiconductor light emitting elements such as LEDs and semiconductor lasers in various applications such as sensing and indicating equipment, but can also be applied with broad versatility to semiconductor light emitting element fabrication. It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the spirit and scope of the invention as defined in the appended claims. The present patent application is based on Application No. 2013-7896 filed in Japan on Jan. 18, 2013, the content of which is incorporated herein by reference.

What is claimed is:

1. A light emitting device comprising:
a substrate;
semiconductor light emitting elements mounted on the substrate;
a mold frame that surrounds the periphery of the light emitting elements on the substrate; and
resin layers that fill the inside of the mold frame,
wherein the mold frame includes a first mold frame, and a second mold frame formed on top of the first mold frame,
wherein the resin layers comprises:
a first resin layer that embeds the light emitting elements in resin and is formed with a height approximately equal to the height of the to of the first mold frame; and
a second resin layer formed on top of the first resin layer with a height approximately equal to the height of the top of the second mold frame,
wherein wavelength-shifting material to change the wavelength of light emitted from the semiconductor light emitting elements is included in at least one of the resin layers, which are the first resin layer and the second resin layer, and
wherein part of the second mold frame covers a portion of an upper surface of the edge of the first resin layer.

2. The light emitting device as cited in claim 1 wherein the substrate has an insulating planar surface, conducting material is formed on top of the insulating planar surface, and the semiconductor light emitting elements are electrically connected to the conducting material.

3. The light emitting device as cited in claim 1 wherein the first resin layer includes wavelength-shifting material to change the wavelength of light emitted from the semiconductor light emitting elements.

4. The light emitting device as cited in claim 1 wherein the second resin layer includes light diffusing material to diffuse light emitted from the semiconductor light emitting elements.

5. The light emitting device as cited in claim 1 wherein boundaries between the bottom edges of the inside surfaces of the first mold frame and the substrate are positioned further inside the mold frame than the bottom edges of the inside surfaces of the second mold frame.

6. The light emitting device as cited in claim 1 wherein part of the second mold frame covers the top of the first mold frame.

7. The light emitting device as cited in claim 1 wherein the position of the bottom edge of the inside surface of the second mold frame is further inside the mold frame than the position of interface between the first resin layer and the top of the first mold frame.

8. The light emitting device as cited in claim 1 wherein the second mold frame covers upper and outer surfaces of the first mold frame.

9. The light emitting device as cited in claim 1 wherein the walls of the second mold frame are made wider as viewed from above than the walls of the first mold frame.

10. A light emitting device comprising:
a substrate;
semiconductor light emitting elements mounted on the substrate;
a mold frame that surrounds the periphery of the light emitting elements on the substrate; and
resin layers that fill the inside of the mold frame,
wherein the mold frame includes a first mold frame, and a second mold frame formed on top of the first mold frame,
wherein the resin layers comprises:
a first resin layer that embeds the light emitting elements in resin and is formed with a height approximately equal to the height of the top of the first mold frame; and
a second resin layer formed on top of the first resin layer with a height approximately equal to the height of the top of the second mold frame,
wherein wavelength-shifting material to change the wavelength of light emitted from the semiconductor light emitting elements is included in at least one of the resin layers, which are the first resin layer and the second resin layer, wherein the walls of the second mold frame are made wider as viewed from above than the walls of the first mold frame, and wherein a protection device is connected with reverse polarity in parallel with the semiconductor light emitting elements, and the protection device is embedded inside the second mold frame.

11. The light emitting device as cited in claim 1 wherein the center region of the second resin layer is formed with approximately the same height as the top of the second mold frame.

12. The light emitting device as cited in claim 1 wherein the center region of the second resin layer is formed with a height exceeding the top of the second mold frame.

13. The light emitting device as cited in claim 1
wherein the wavelength-shifting material is fluorescent material that is excited by light emitted by the semiconductor light emitting elements, and
wherein the first resin layer includes a fluorescent material layer and a light-transmitting resin layer formed on top of the fluorescent material layer.

14. A method of manufacturing a light emitting device, the light emitting device comprising:
a substrate;
semiconductor light emitting elements mounted on the substrate;
a mold frame that surrounds the periphery of the light emitting elements mounted on the substrate; and
resin layers that fill the encapsulating region established inside the mold frame,
the method comprising:
forming a first mold frame on top of the substrate;
filling the encapsulating region inside the first mold frame with a first resin to a height approximately equal to the top of the first mold frame in a manner that encapsulates the light emitting elements mounted in the encapsulating region:
forming a second mold frame covering at least part of the first mold frame after solidifying the first resin to form a first resin layer such that part of the second mold frame covers a portion of an upper surface of the edge of the first resin layer;
filling the inside the second mold frame with a second resin to a height approximately equal to the top of the second mold frame; and
solidifying the second resin to form a second resin layer.

15. A method of manufacturing a light emitting device, the method comprising:
preparing a substrate with conducting material disposed on top of an insulating planar surface;
mounting semiconductor light emitting elements on the substrate in a manner making electrical connection with the conducting material, and to form a first mold frame around the periphery of the light emitting elements;
forming a first resin layer in the region established inside the first mold frame;
forming a second mold frame over the upper surface of the first mold frame such that part of the second mold frame covers a portion of an upper surface of the edge of the first resin layer; and
forming a second resin layer in the region established by the second mold frame.

16. The method of manufacturing a light emitting device as cited in claim 14 wherein the viscosity of the resin used to form the first mold frame is higher than the viscosity of the resin used to form the second mold frame.

17. The light emitting device as cited in claim 1 wherein the first mold frame is formed in a dome-shape.

18. The light emitting device as cited in claim 1 wherein the second mold frame is formed in a dome-shape.

* * * * *